United States Patent [19]
Wohlin et al.

[11] Patent Number: 5,952,711
[45] Date of Patent: Sep. 14, 1999

[54] LEAD FINGER IMMOBILIZATION APPARATUS

[76] Inventors: Leslie Theodore Wohlin, 803 Brookview Dr., Greensburg, Pa. 15601; John Frederick Wohlin, 438 Edgetree Dr., Murrysville, Pa. 15668

[21] Appl. No.: 08/713,169

[22] Filed: Sep. 12, 1996

[51] Int. Cl.$^6$ .................... H01L 23/495; H01L 23/053
[52] U.S. Cl. .................... 257/668; 257/666; 257/701
[58] Field of Search ................... 257/168, 701, 257/676

[56] References Cited

U.S. PATENT DOCUMENTS 5,554,885  9/1996  Yamasaki et al. ............... 257/666

FOREIGN PATENT DOCUMENTS

| 4-204459 | 8/1993 | Germany | 257/668 |
| 4-297046 | 10/1992 | Japan | 257/668 |
| 4-369234 | 12/1992 | Japan | 257/668 |
| 5-235091 | 9/1993 | Japan | 257/668 |

Primary Examiner—Teresa M. Arroyo
Attorney, Agent, or Firm—Feed Smith Shaw & McClay LLP

[57] ABSTRACT

A lead finger immobilization apparatus is disclosed. The apparatus utilizes a perforated layer of a nonconductive material.

1 Claim, 5 Drawing Sheets

LEAD FINGER IMMOBILIZATION APPARATUS

TECHNICAL FIELD

The present invention relates to the packaging of integrated circuit dies and, more particularly, to a lead finger immobilization apparatus.

BACKGROUND

Very similar processes are utilized to manufacture a large variety of integrated circuit packages or chips. A starting substrate, e.g., a thin wafer of silicon or gallium arsenide, is masked, etched and doped during several process steps, with the type, number and order of the steps depending on the type of integrated circuit being manufactured, to form a number of dies or separate integrated circuits thereon. The dies are singulated or separated with a wafer saw and then packaged individually to form integrated circuit packages or chips.

Each die typically has a back that is devoid of circuitry and a front having integrated circuitry formed thereon. The integrated circuitry is accessible via die wire bonding pads that may be arranged in a variety of configurations on the face or edges of the die.

During the packaging process, each die is attached to a corresponding lead frame. The lead frames are processed in groups, typically in strips or in a continuous coil form. Each strip contains multiple, e.g., six, lead frames and is several, e.g., nine, inches long. A coil contains a larger number of lead frames because it is a much longer continuous strip of material. Each lead frame strip or coil typically is a metal frame designed to support several dies for packaging and 1o provide the leads for the final integrated circuit package.

A typical lead frame strip or coil is produced from metal sheet stock, e.g., a copper or nickel alloy, by subjecting the sheet stock to a stamping or photochemical etch process to form lead fingers, mounting paddles and side rails having pilot holes therein. The side rails and pilot holes therein facilitate transport and indexing of the lead frame strip or coil by automated packaging machinery. For example, a lead frame strip, individually, or a lead frame coil, as a whole, can be removably clipped to carrier belts that move the lead frame strip or coil through the various manufacturing stages.

Each lead frame has a plurality of lead fingers for connection to the die bonding pads. Each lead frame might further include a mounting paddle to which a corresponding die is attached. The paddle is usually about the same length and width as the die. Alternatively, each die can be attached to a lead frame with a tape comprising a nonconductive plastic or polymide carrier material having an adhesive on one or both sides.

If a mounting paddle is used, the paddle is typically downset or stamped to a plane below that of the rest of the lead frame prior to attaching the die so that the bottom of the attached die rests below the lead fingers on the lead frame. The downset paddle permits the attached die to be positioned so that the distance from the top of the die to the bottom of the paddle is roughly centered with respect to the plane of the lead frame. In this configuration, the amount of mold compound above the die roughly equals the amount below the die, which reduces the amount of stress on the bond wires from the flow of mold compound during the encapsulation process. Moreover, a paddle without a downset can cause the final chip to bow due to the shrinkage of the mold compound as it cures. The paddle downset also permits shorter bond wires, which reduce the inductance of the wires, reduce the probability of wire movement during encapsulation and reduce the amount of material, often gold, consumed for bond wires.

The lead fingers typically are spot plated with paladium, gold or silver along with the mounting paddle, in part because the paddle cannot be easily masked during the plating process. The conductive leads are plated to provide a metallic surface to which wires may be bonded, as a bond wire usually will not stick directly to lead frame material, such as copper or nickel or alloys thereof.

During a conventional packaging process, each die is attached to a mounting paddle with an adhesive layer, although thermoplastic, tape or other materials are also used. The adhesive layer typically is formed of an epoxy, acrylic, silicone or polymide material that is sandwiched between the back of the die and the mounting paddle.

Regardless of the method utilized to attach each die to its corresponding lead frame, the die bonding pads are electrically connected to the lead fingers of the lead frame with fine bond wires that can be formed using an ultrasonic bonding method. Following the application of a polymide protective layer to the face of each die, each die, its corresponding bond wires and a portion of its corresponding lead fingers are encapsulated in a protective plastic casing via a pressurized, resin-injection mold process, resulting in an integrated circuit package. The casing protects the die from environmental damage, e.g., breakage, physical abuse and contamination by moisture and chemicals. A portion of the lead fingers extend beyond the casing to permit electrical connections between the encapsulated die and a printed circuit board or other external circuitry for eventual use in an application.

After encapsulation, the packages require a deflashing process for removing excess molding material from the casing exterior. A trim and form operation then singulates the resultant interconnected packages and bends the protruding lead fingers of each package into an appropriate shape.

As the demand for thinner packages increases, it becomes desirable to make the die-lead frame assembly thinner, which can be accomplished by reducing the thickness of the lead frame. However, thinner lead frames exacerbate the problems of lead movement during processing. Thinner lead frames also can result in package leads that are easily damaged or misaligned. Lead movement is especially problematic after wire bonding. The lead fingers are relatively long for their thickness and, therefore, can bend and move around quite easily. As the assembly is transported to the location of the encapsulation step, the wire connections can be broken and shorts can occur. Lead movement increases as the thickness of the lead frame decreases.

To alleviate this problem, manufacturers often apply tape across the lead fingers prior to die attachment to immobilize the lead fingers so that lead movement is greatly reduced or eliminated. The tape comprises a nonconductive plastic or polymide carrier material having an adhesive on one side. Usually, multiple pieces of tape are applied to each lead frame, with the number of pieces and location and shape of each piece depending on the configuration of lead fingers to be taped. The tape should be applied at locations where the need for immobilization is greatest, which will vary greatly depending on the particular lead frame design being used.

The tape can be applied to the lead fingers by an automated tape applicator that utilizes a series of rollers to remove the backing from a roll of tape, carry the tape strip over a lead frame strip or coil, stamp an appropriately-shaped piece of tape out of the tape strip, press the adhesive side of the tape piece against the lead fingers of a lead frame and activate the adhesive on the tape piece, e.g, by heating the tape piece and underlying lead frame strip or coil. Multiple passes through the tape applicator may be required if multiple pieces of tape are to be applied to each lead frame.

During encapsulation, however, the solid lead frame tape restricts the flow of mold compound between the lead fingers and other features of the lead frame where the tape is present. As a result, the protective casing is more prone to delamination, i.e., separation of the mold compound from either side of the lead frame. Delamination is most likely to occur where the solid lead frame tape forms a continuous, i.e., uninterrupted, path around the center of the integrated circuit package.

SUMMARY OF THE INVENTION

The current invention provides an apparatus that both mitigates lead finger movement during processing and overcomes the above-described problem of delamination. A lead finger immobilization apparatus is disclosed. The apparatus utilizes a perforated layer of a nonconductive material. The primary advantage of the present invention over conventional lead frame tape is that delamination of the mold compound is prevented.

DESCRIPTION OF THE PREFERRED EMBODIMENT

Figure 1:
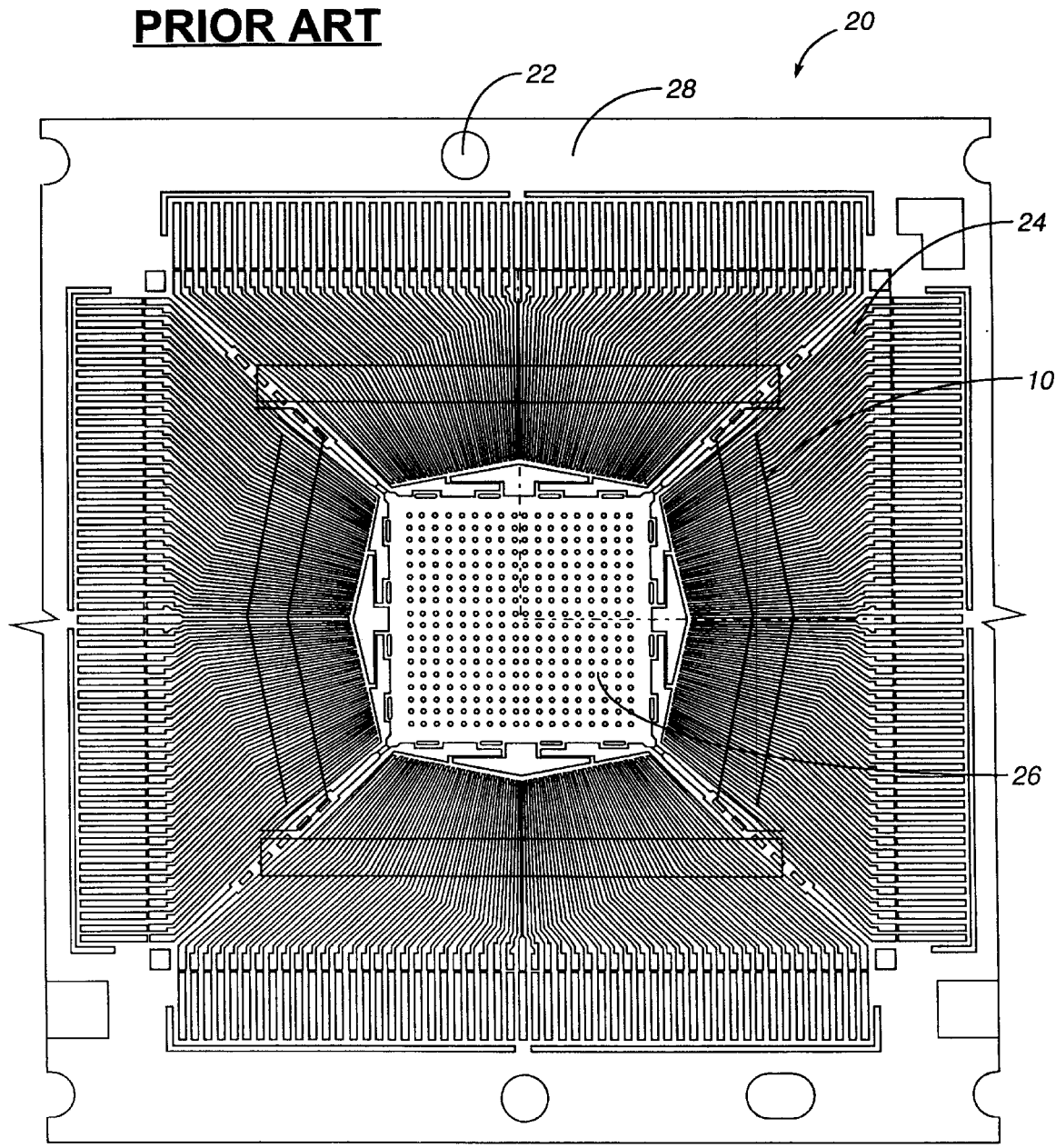
FIG. 1 is a plan view of a lead frame to which conventional lead finger immobilization devices have been applied to immobilize the lead fingers.
Figure 2:
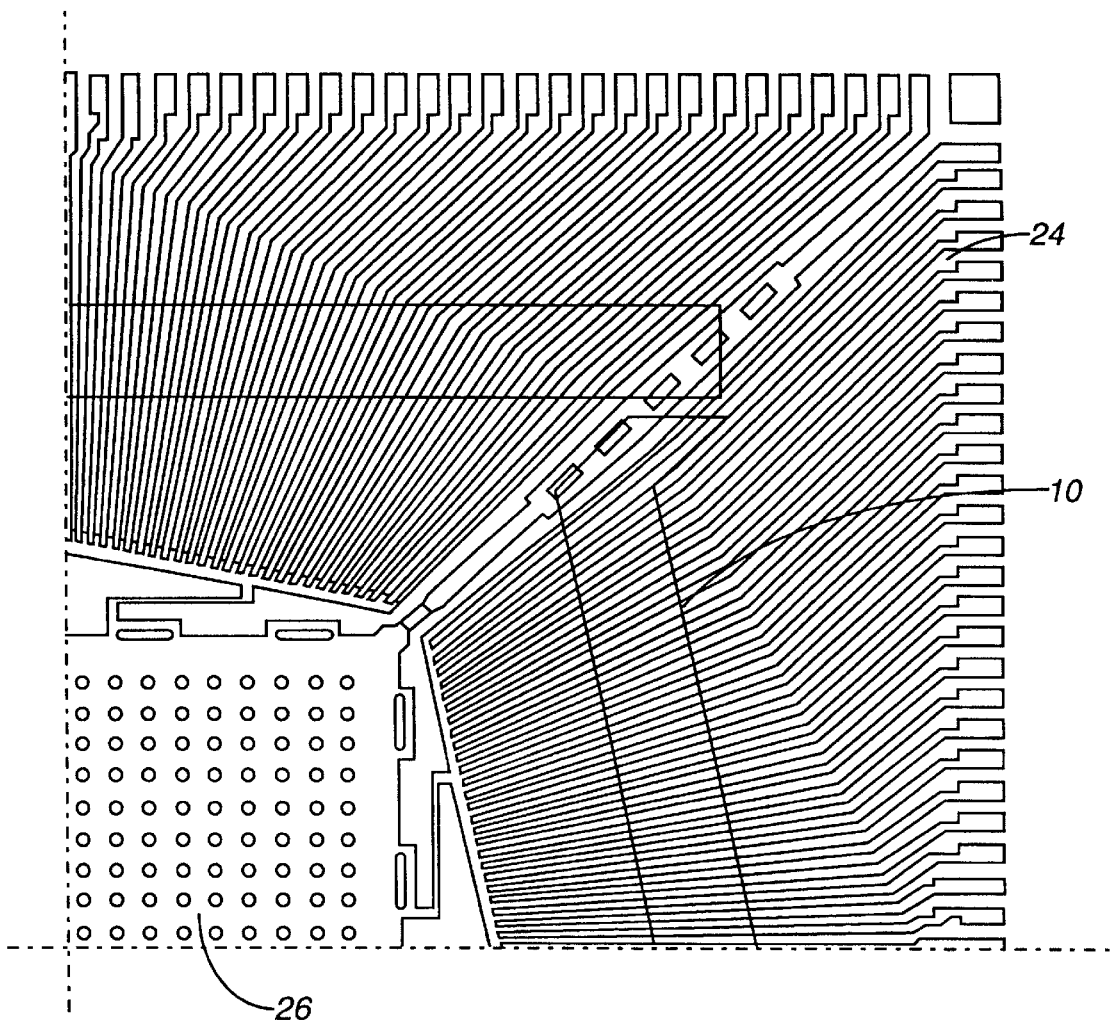
FIG. 2 is an exploded plan view of a section of the lead frame depicted in FIG. 1.

Referring to FIGS. 1 and 2, a plan view of a lead frame 20, which is part of a lead frame strip or coil, is depicted. Lead frame 20 includes lead fingers 24, a mounting paddle 26, side rails 28 and pilot holes 22 in side rails 28. The lead frame design depicted is only one of an endless variety of lead frame designs that are used in practice, depending both on the type of integrated circuit die to be encapsulated and on the package design to be utilized.

The thickness, width and length of lead frames vary greatly, as do the shape, size and location of the lead fingers formed therein. The present invention can be applied beneficially to lead frames of all thicknesses and lead fingers of all widths and lengths. Typically, the thickness of the lead frame is approximately 0.004 to 0.01 inches, e.g., 0.008 inches; the width of each lead finger is approximately 0.004 to 0.06 inches, e.g., 0.005 inches; and the length of each lead finger is approximately 0.2 to 1.25 inches, e.g., 0.300 to 0.400 inches.

As discussed above, mounting paddle 26 on which an integrated circuit die can be mounted is optional. Other methods for attaching an integrated circuit die to the lead frame are possible, e.g., via double-sided lead frame tape. The shape, size and location of side rails 28 and pilot holes 22 will depend primarily on the type of machinery used to process the lead frame.

It can be seen that four conventional lead finger immobilization devices 10 have been applied close to the ends of lead fingers 24 to immobilize them so as to avoid the hazards of lead movement described above. Each device 10 comprises a solid layer of nonconductive material, e.g., plastic or polymide. Each device 10 is attached to lead fingers 24 via a bonding layer of nonconductive material that is sandwiched between lead fingers 24 and the solid layer. The bonding layer may be part of device 10, i.e., device 10 may be a tape. Alternatively, the bonding layer may be applied to either device 10 or lead fingers 24 just prior to attachment of device 10 to lead fingers 24. The bonding layer may comprise an adhesive, e.g., epoxy, acrylic, silicone, polymide or thermosetting synthetic rubber; a thermoplastic; a tape, e.g., double-sided lead frame tape; or another type of bonding material.

It is apparent that the number of devices 10 and the location and shape of each device 10 will depend on the configuration of lead fingers 24 to be immobilized. Devices 10 are applied at locations where the need for immobilization is greatest, e.g., near the end of lead fingers 24.

If device 10 is tape, each device 10 can be applied to lead fingers 24 by an automated tape applicator that utilizes a series of rollers to remove the backing from a roll of tape, carry the tape strip over a lead frame strip or coil, stamp an appropriately-shaped device 10 out of the tape, press the adhesive side of device 10 against lead fingers 24 of lead frame 20 and activate the adhesive on device 10, e.g, by heating device 10 and lead frame 20. Multiple passes through the tape applicator may be required if multiple devices 10 are to be applied to each lead frame 20.

During encapsulation, however, conventional device 10 restricts the flow of mold compound between lead fingers 24 and other features of lead frame 20 where a device 10 is present. As a result, the protective casing is more prone to delamination, i.e., separation of the mold compound from either side of lead frame 20.

Figure 3:
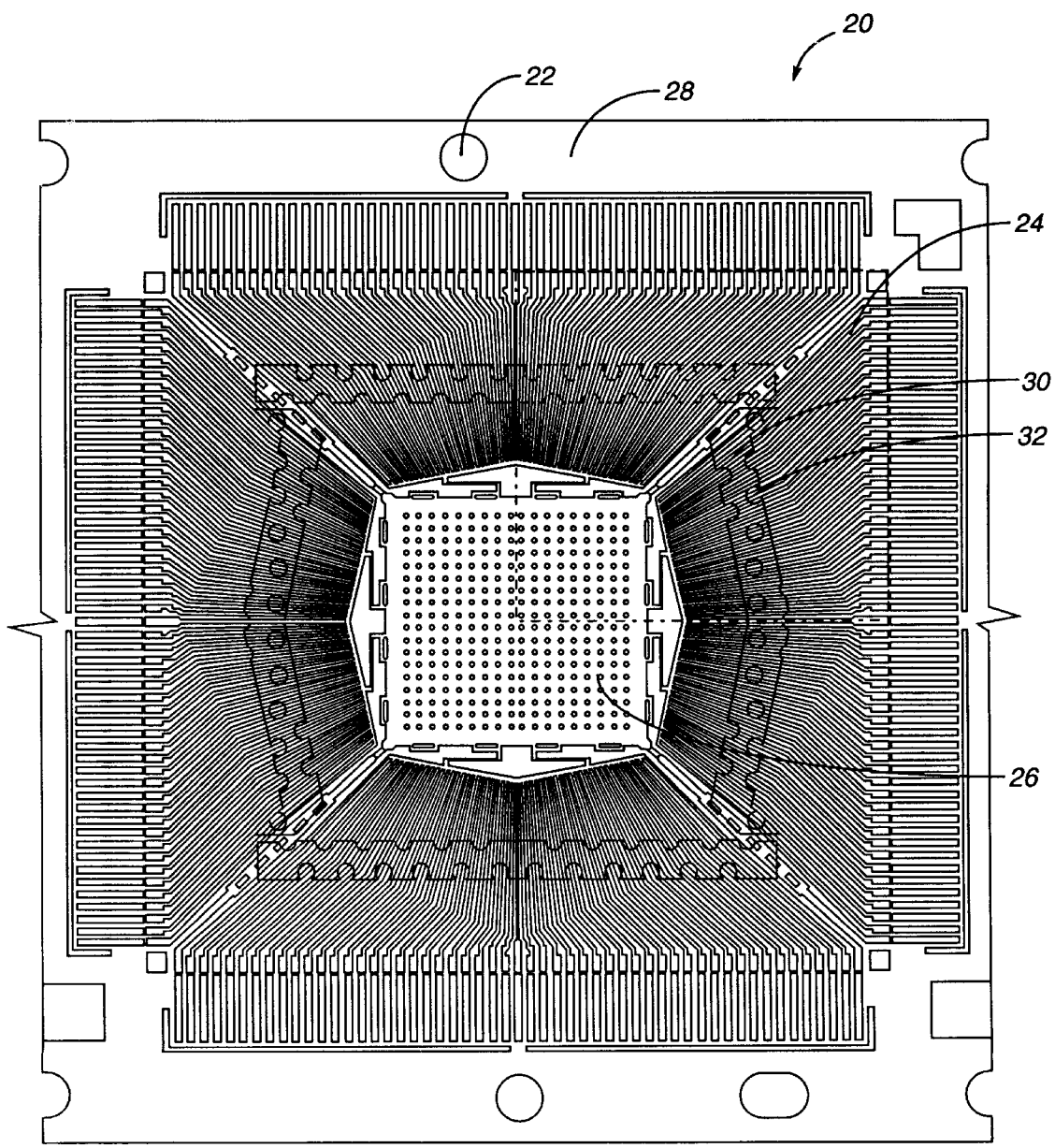
FIG. 3 is a plan view of a lead frame to which perforated lead finger immobilization devices have been applied to immobilize the lead fingers.
Figure 4:
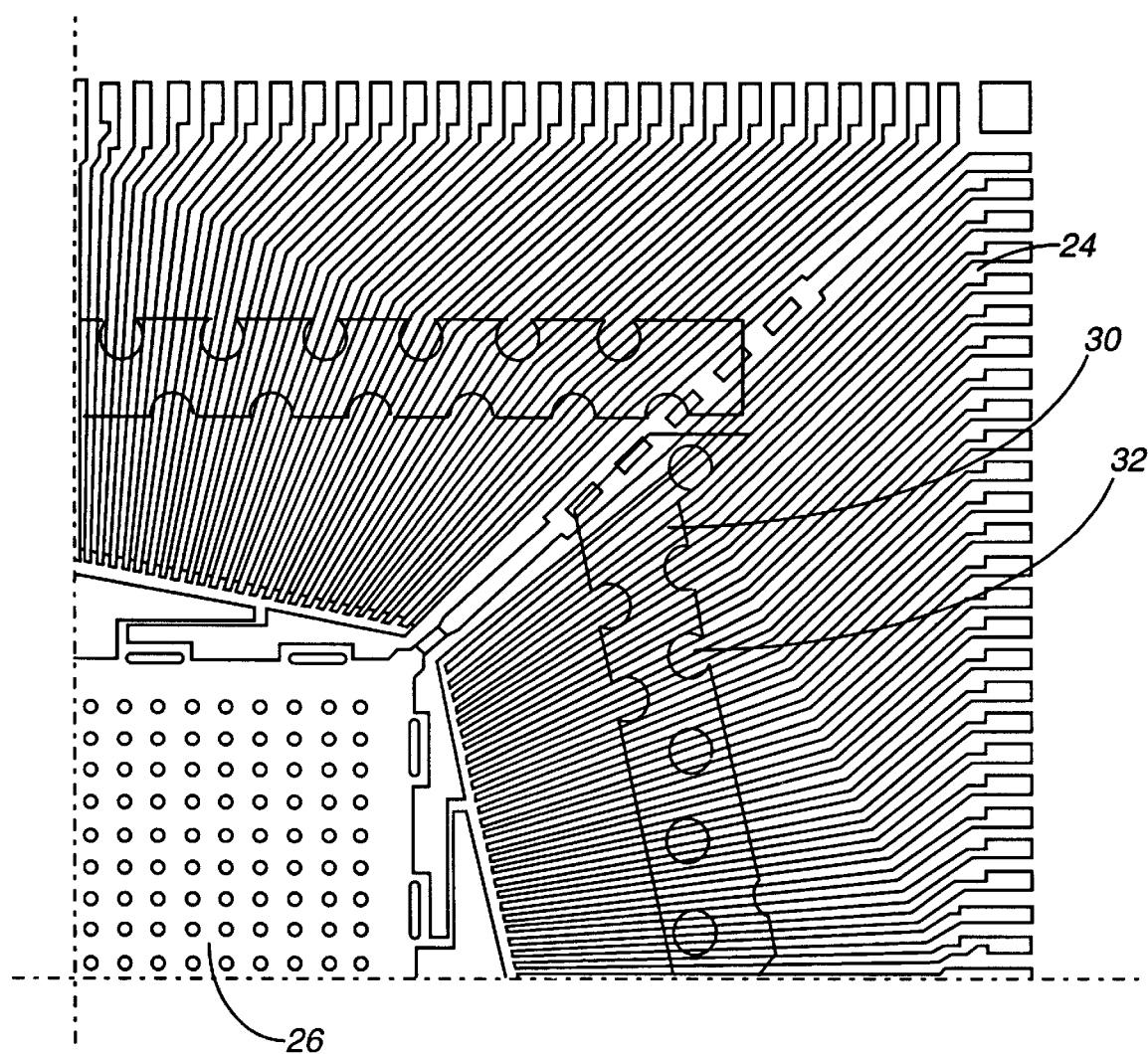
FIG. 4 is an exploded plan view of a section of the lead frame depicted in FIG. 3.

Referring to FIGS. 3 and 4, perforated lead finger immobilization devices 30 have been applied to lead fingers 24 of lead frame 20. The description above with respect to conventional lead finger immobilization devices 10 and lead frame 20 applies to perforated lead finger immobilization devices 30, with the exception that perforations 32 have been formed in devices 30, e.g., stamped with a punch and die or etched. Perforations 32 in devices 30 permit mold compound to flow through perforations 32 in the tape during the encapsulation process, resulting in a more secure bond between the mold compound on one side of lead frame 20 with the mold compound on the other side of lead frame 20 and, therefore, a casing that is significantly less prone to delamination.

Figure 5:
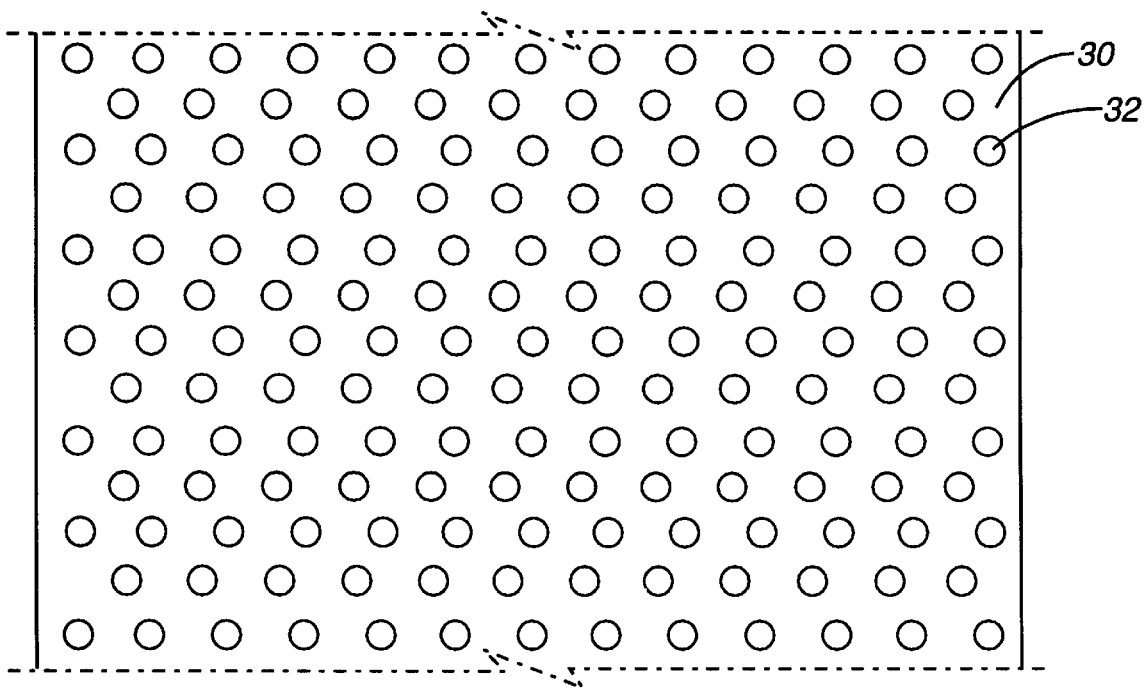
FIG. 5 is a plan view of perforated lead frame tape.

If device 30 is tape, perforations 32 can be formed in a roll of conventional lead frame tape before loading the roll into an automatic tape applicator, resulting in perforated lead frame tape as depicted in FIG. 5. After perforations 32 are formed in the roll of tape, application of the perforated tape to lead fingers 24 proceeds as described above.

In general, a perforated lead finger immobilization device 30 comprises a perforated layer of nonconductive material, e.g., plastic or polymide.

Preferably, perforations 32 are substantially circular in shape so as to maximize the amount of surface area through which the mold compound can flow, while minimizing the loss in structural integrity of device 30 caused by the formation of perforations 32 therein. Perforations 32 of any shape, however, can be used. Preferably, perforations 32 are uniform in both shape and size to facilitate the manufacture of devices 30. Perforations 32 in any single device 30, however, need not be uniform in either shape or size. If circular perforations 32 are used, each perforation can be scaled appropriately, depending on the dimensions of the lead frame. Typically, each perforation has a radius of approximately 0.005 to 0.05 inches, e.g., 0.015 inches.

As noted above, there are competing considerations between increasing the porosity of a device 30 to the flow of mold compound during encapsulation and maintaining the structural integrity of device 30 so that it is able to serve its purpose of immobilizing lead fingers 24. One way to quantify these competing considerations is to calculate the ratio of the total surface area of perforations 32 in device 30 to the total surface area of the device 30, including the total surface area of perforations 32 therein. This ratio can be used to index the relative porosity of two devices 30, with a higher ratio corresponding to a higher porosity, as well as a generally lower structural integrity. The range of allowable ratios can vary greatly for different package configurations and applications. Typically, the ratio is approximately ten (10) to eighty (80) percent, e.g., twenty-five percent (25%).

Optionally, device 30 comprises a bonding layer of nonconductive material, e.g., an adhesive, thermoplastic or tape, subjacent the perforated layer of nonconductive material for attaching device 30 to lead fingers 24. Acceptable adhesives include, without limitation, epoxy, acrylic, silicone, polymide and thermosetting synthetic rubber. Acceptable tape includes, without limitation, conventional double-sided lead frame tape.

Although the present preferred embodiment of the invention has been described in the context of a particular lead frame design, the present invention could be utilized in conjunction with a multitude of other types of lead frame designs. Although we have illustrated and described a present preferred embodiment of the invention and variations thereof, the invention is not limited thereto but may be embodied otherwise within the scope of the following claims.

I claim:

1. A lead finger immobilization apparatus comprising a perforated layer of a first nonconductive material having perforations, wherein the perforated layer comprises a perforation having a generally circular shape, wherein the perforation has a radius of approximately 0.005 to 0.05 inches.

* * * * *